(12) United States Patent
Lo

(10) Patent No.: US 11,989,874 B2
(45) Date of Patent: May 21, 2024

(54) MULTI-TIER PCBA INTEGRITY VALIDATION PROCESS

(71) Applicant: Hewlett Packard Enterprise Development LP, Houston, TX (US)

(72) Inventor: Khiam Foh Lo, Singapore (SG)

(73) Assignee: Hewlett Packard Enterprise Development LP, Spring, TX (US)

( * ) Notice: Subject to any disclaimer, the term of this patent is extended or adjusted under 35 U.S.C. 154(b) by 374 days.

(21) Appl. No.: 17/576,481

(22) Filed: Jan. 14, 2022

(65) Prior Publication Data
US 2023/0230225 A1 Jul. 20, 2023

(51) Int. Cl.
*G06T 7/00* (2017.01)

(52) U.S. Cl.
CPC .... *G06T 7/001* (2013.01); *G06T 2207/30141* (2013.01)

(58) Field of Classification Search
CPC . G06T 2207/10004; G06T 2207/30141; G06T 7/0004; G06T 2207/30164; G06F 30/398; G06F 2115/12; G05B 2219/45031; G01N 2021/95638; G01N 21/956; G01N 2021/95646; G06V 2201/06
See application file for complete search history.

(56) References Cited

U.S. PATENT DOCUMENTS

| | | | |
|---|---|---|---|
| 6,477,266 B1 * | 11/2002 | Asar | G01N 21/95607 |
| | | | 382/147 |
| 6,816,751 B1 * | 11/2004 | Alice | H05K 13/084 |
| | | | 700/109 |
| 7,035,097 B2 | 4/2006 | Petrov et al. | |
| 9,836,417 B2 | 12/2017 | Mccabe et al. | |
| 10,197,982 B2 | 2/2019 | Sari et al. | |
| 10,255,020 B1 | 4/2019 | Foster | |
| 10,810,347 B2 | 10/2020 | Qian et al. | |
| 11,435,298 B2 * | 9/2022 | Moore | H05K 13/081 |
| 2004/0010444 A1 * | 1/2004 | Delorme | G01R 31/281 |
| | | | 702/183 |
| 2005/0280981 A1 | 12/2005 | Chen | |
| 2011/0022524 A1 | 1/2011 | Monahan | |
| 2012/0050522 A1 * | 3/2012 | Van Slyck | H04N 7/188 |
| | | | 382/141 |
| 2012/0323352 A1 | 12/2012 | Groth | |
| 2016/0156603 A1 | 6/2016 | Janik | |

(Continued)

*Primary Examiner* — Ian L Lemieux
(74) *Attorney, Agent, or Firm* — Yao Legal Services, Inc.

(57) ABSTRACT

The system stores a first template which comprises an image of a first validated printed circuit board assembly (PCBA) and stores a first image of an unvalidated PCBA captured prior to shipping of the unvalidated PCBA from a first site to a second site. The system generates a second template which comprises an image of a second validated PCBA corresponding to the first validated PCBA. The system captures a second image of the unvalidated PCBA subsequent to arrival at the second location and a third image prior to installation into a computer system. The system detects an anomaly associated with the unvalidated PCBA based on comparisons between one or more of: the first template and the second template; the first image and the first template; the second image and the second template; the third image and the second template; the first image, the second image, and the third image.

20 Claims, 12 Drawing Sheets
(3 of 12 Drawing Sheet(s) Filed in Color)

(56) References Cited

U.S. PATENT DOCUMENTS

| | | | |
|---|---|---|---|
| 2020/0013156 A1* | 1/2020 | Weiss | G06V 10/771 |
| 2020/0097242 A1 | 3/2020 | Curtis et al. | |
| 2022/0012917 A1* | 1/2022 | Kelly | H05K 13/082 |
| 2022/0375056 A1* | 11/2022 | Weiss | G06T 7/11 |
| 2023/0152785 A1* | 5/2023 | Weiss | G05B 19/4184 |
| | | | 700/108 |
| 2023/0171935 A1* | 6/2023 | Moore | H05K 13/083 |
| | | | 382/141 |

* cited by examiner

MULTI-TIER PCBA INTEGRITY VALIDATION PROCESS

BACKGROUND

Field

This disclosure is generally related to the field of production management. More specifically, this disclosure is related to multi-tier printed circuit board assembly (PCBA) integrity validation process.

BRIEF DESCRIPTION OF THE FIGURES

The patent or application file contains at least one drawing executed in color. Copies of this patent or patent application publication with color drawing(s) will be provided by the Office upon request and payment of the necessary fee.

In the figures, like reference numerals refer to the same figure elements.

DETAILED DESCRIPTION

Figure 1:
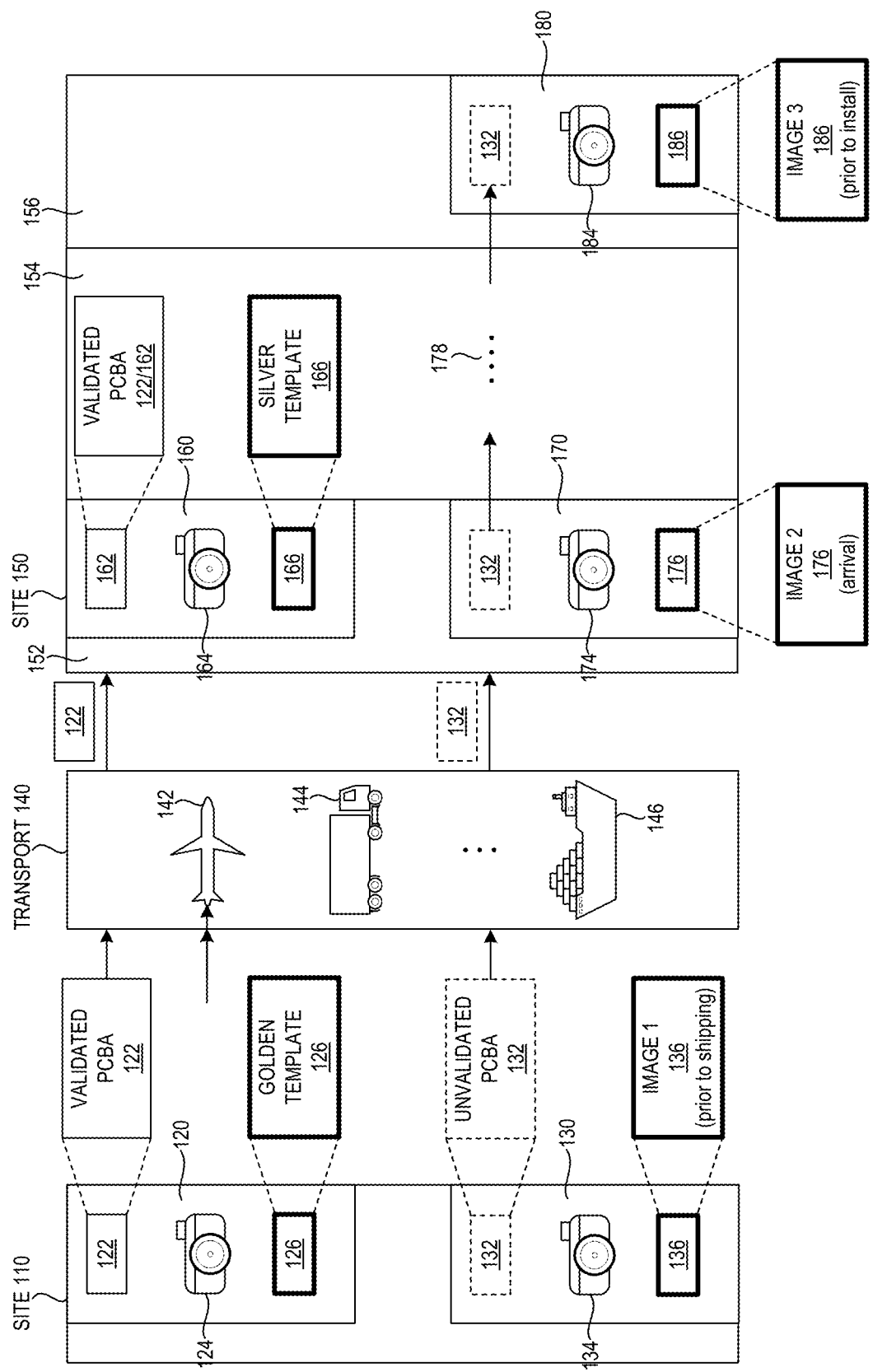
FIG. 1 illustrates an environment which facilitates a multi-tier PCBA integrity validation process, in accordance with an aspect of the present application.

The following description is presented to enable any person skilled in the art to make and use the aspects and examples, and is provided in the context of a particular application and its requirements. Various modifications to the disclosed aspects will be readily apparent to those skilled in the art, and the general principles defined herein may be applied to other aspects and applications without departing from the spirit and scope of the present disclosure. Thus, the aspects described herein are not limited to the aspects shown, but are to be accorded the widest scope consistent with the principles and features disclosed herein.

The production and assembly of a printed circuit board (PCB) and the final assembly of the PCB generally occur at different physical factories or sites. The PCB assembly can occur at a first site (e.g., a factory at which components are mounted onto the PCB to obtain a PCB assembly (PCBA) and the final assembly (FA) can occur at a second site (e.g., an FA factory). In general, the term "PCB" refers to a fabricated board without components mounted on the board, while the term "PCBA" refers to a fabricated board with components mounted on the board. In this disclosure, the terms PCB and PCBA may be used interchangeably. Between the two sites and at various stages of processing/shipping/handling during the supply chain, the PCBA may be subject to integrity breaches relating to humans, knowledge, technology, and processes. These breaches may involve both cyber or online security and physical security and may result in vulnerabilities based on attacks related to political or commercial use. PCBAs may be authenticated in several different areas, including: product and firmware authentication check; computer vision intelligence; electrical testing; impedance scan testing; and a run-time thermal scan.

The described aspects provide a system which uses computer vision intelligence to ensure integrity validation and perform detection of anomalies (e.g., PCBAs which do not conform to an expected template or standard). Computer vision intelligence systems can be used to perform intelligent analysis of components (e.g., packaging, count, identification, height), boards (e.g., via verification, connector verification, and estate occupancy), and images (e.g., surface-based landscape intelligence analysis, grid-based analysis, and color-greyscale analysis).

The described aspects leverage computer vision systems to ensure integrity validation and perform anomaly detection of PCBAs by using a "golden template" (an image of a validated PCBA taken at the first site using a first optical setup) and a "silver template" (image of the same or another validated PCBA taken at the second site using a second optical setup). Because environmental conditions such as air temperature and lighting and optical lens differences may not precisely match, it can be challenging to configure two optical setups in exactly the same manner, e.g., to obtain two identical images of a same physical object (such as a validated PCBA). As a result, the first and second optical setups can be configured to match as much or as closely as possible, but may vary by an amount less than a certain threshold.

Using the generated golden and silver templates, the described aspects can detect anomalies in an unvalidated PCBA by capturing multiple images of the unvalidated PCBA in various stages (e.g., using a computer vision system) and comparing the multiple images with the golden and silver templates and with each other. The multiple images of the unvalidated PCBA can include: a "first image" captured or taken prior to shipping from the first site to the second site; a "second image" captured or taken subsequent to arrival at the second site; and a "third image" captured or taken prior to installation in a computer system or assembly line, as described below in relation to FIGS. 1, 4B, and 6A.

The described aspects can also use the computer vision system to perform the comparisons of the images for a given PCBA in multiple tiers, e.g., once for each of the following three tiers or layers based on: a percentage of space occupied and not occupied by components residing on the given PCBA; a number of components residing on the given PCBA; and a placement of tracks which run on the given PCBA.

By performing these comparisons of the images taken at different stages of the supply chain process and by using the multiple tiers for analysis, the described aspects can detect anomalies by identifying issues which may occur during production at the first site, transportation between the sites, and handling before installation at the second site.

Overview of Computer Vision Systems

In general, computer vision systems can involve image acquisition, image analysis, and result reporting. Image acquisition can be performed by hardware (including various optical setups) and can depend on sensor image quality, optical lens design and performance, and lighting reliability and repeatability. Image analysis can be performed by software and can include component verification, machine vision algorithm, and machine vision software. Result reporting can be performed by a system and can include integration (e.g., data correlation with manufacturing records) and outcome visualization (e.g., outlier identification, potential risk prediction, heat map generation, and alert/notification/investigation).

Figure 2A:
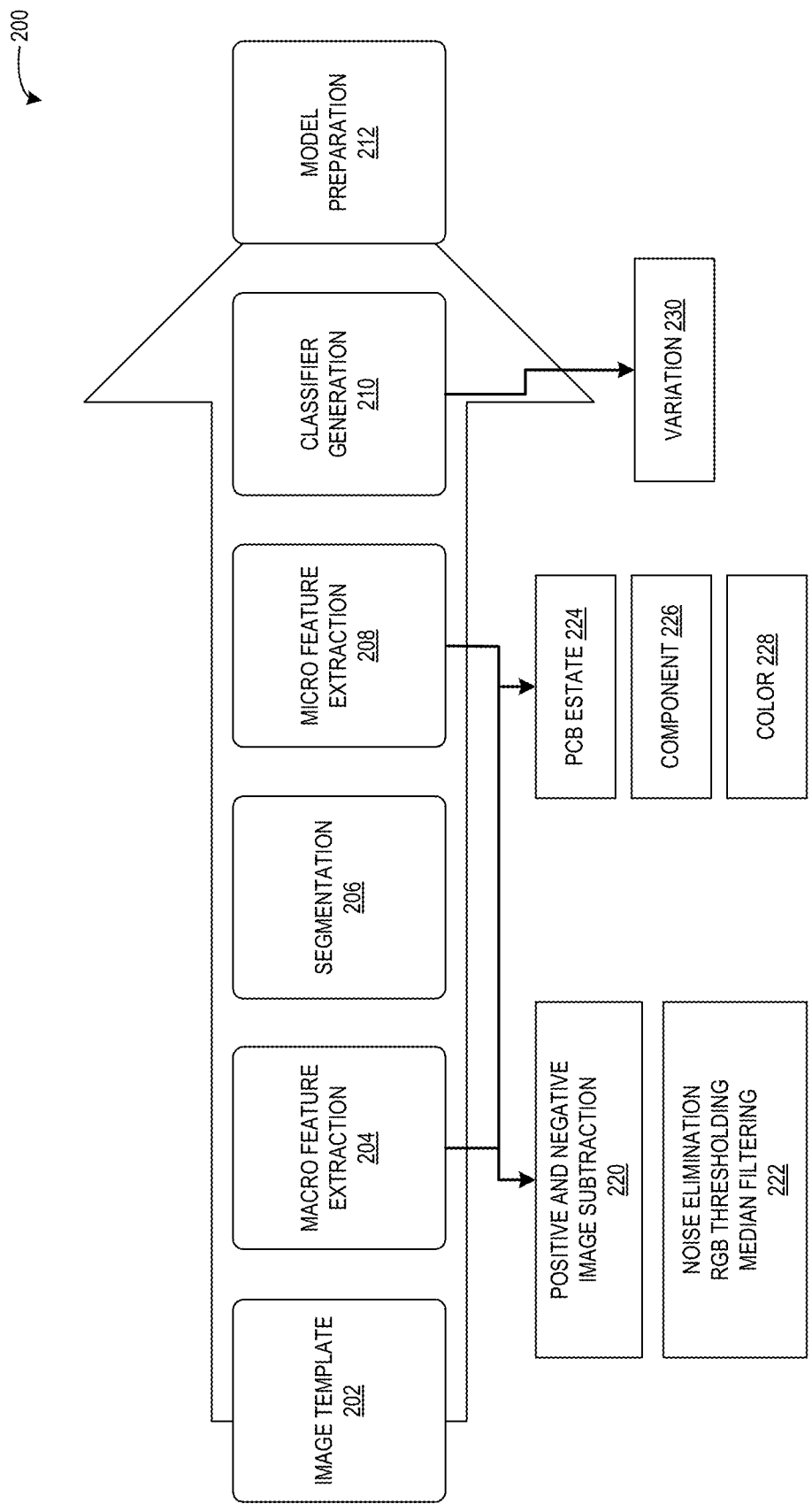
FIG. 2A illustrates a diagram of modules for training a template and model preparation, in accordance with an aspect of the present application.

The system can perform model preparation and outcome visualization by performing various operations via modules. FIG. 2A illustrates a diagram 200 of modules for training a template and model preparation, in accordance with an aspect of the present application. Diagram 200 depicts how the system can take as input an image template 202 and perform macro feature extraction (module 204), segmentation (module 206), and micro feature extraction (module 208). The macro and micro feature extraction can include, e.g., positive and negative image subtraction (module 220), noise elimination, Red Green Blue (RGB) thresholding, and median filtering (module 222), as well as determining the estate (occupied/unoccupied) of the PCB and information associated with a component or a color (respectively, modules 224, 226, and 228). The system can perform classifier generation (module 210), which can be based on a variety of classification methods or classifiers (module 230), and can output information which can be used to prepare the model (module 212).

Figure 2B:
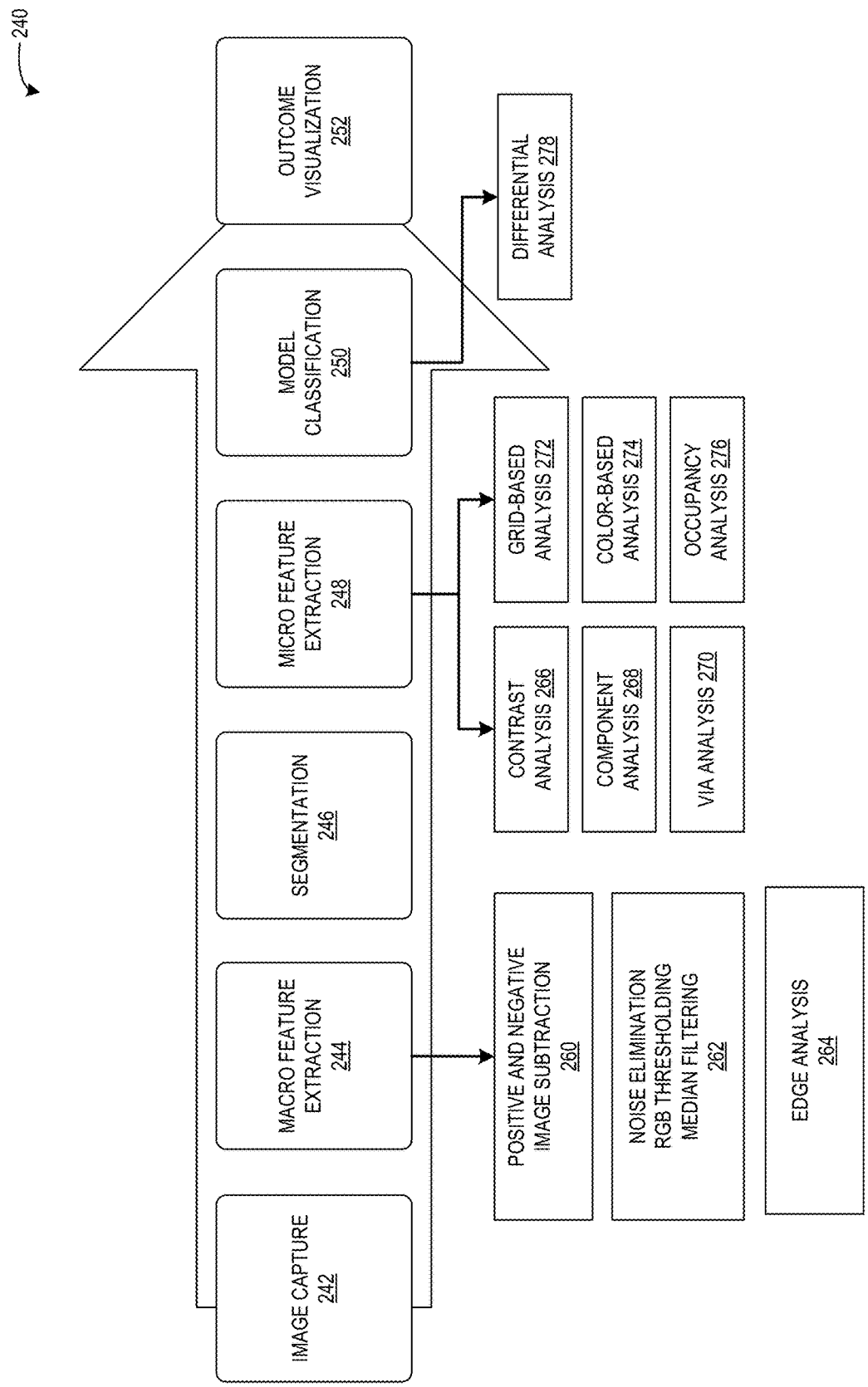
FIG. 2B illustrates a diagram of modules for computer vision and analysis and for outcome visualization, in accordance with an aspect of the present application.

FIG. 2B illustrates a diagram 240 of modules for computer vision and analysis and for outcome visualization, in accordance with an aspect of the present application. Diagram 240 depicts how the system can take as input an image capture or perform the image capture (module 242) and perform macro feature extraction (module 244), which can include, e.g., positive and negative image subtraction (module 260), noise elimination, RGB thresholding, and median filtering (module 262), as well as edge analysis (module 264). The system can perform segmentation (module 246) and micro feature extraction (module 248), which can include, e.g., contrast analysis, component analysis, via analysis, grid-based analysis, color-based analysis, and occupancy analysis (respectively, modules 266, 268, 270, 272, 274, and 276). The system can perform model classification (module 250), e.g., based on differential analysis (module 278), and can output information which can be used to perform outcome visualization (module 252, as described below in relation to FIGS. 5A and 5B).

Diagram 240 depicts steps performed by a computer vision system. The described aspects provide a system which can perform image-to-image comparisons as well as image-to-data comparisons, using the golden template, the silver template, and multiple images of an unvalidated PCBA during various stages of a production/transportation/assembly process, as described below in relation to FIGS. 1, 4A, 4B, and 6A.

Environment which Facilitates a Multi-Tier PCBA Integrity Validation Process

FIG. 1 illustrates an environment 100 which facilitates a multi-tier PCBA integrity validation process, in accordance with an aspect of the present application. Environment 100 can include a first site 110 (e.g., a PCBA factory) and a second site 150 (e.g., a final assembly factory). Each site can include one or more optical setups used to capture images of validated and unvalidated PCBAs. These optical setups may exist in a same or different room or location in each site. As discussed above, even if an image of a physical object (such as a PCBA) is captured by the same optical setup, the variances in environmental conditions may result in challenges in obtaining two identical images of the same physical object. While the optical setups in the same site in environment 100 may occur in the same physical location, the optical setups are depicted as located in distinct locations or rooms for purposes of illustration and to indicate the above-described challenges.

Each optical setup can include a camera or other image-capturing device with a lens, which captures an image of a physical object and outputs a corresponding digital image. For example, site 110 can include a location 120 with an optical setup 124, which captures an image of the physical object (a validated PCBA 122) and outputs the corresponding digital image (a golden template 126). Similarly, site 110 can include a location 130 with an optical setup 134, which captures an image of the physical object (an unvalidated PCBA 132 prior to shipping) and outputs the corresponding digital image (image 1 136).

In addition, site 150 can include: a location 160 with an optical setup 164, which captures an image of the physical object (a validated PCBA 122/162) and outputs the corresponding digital image (a silver template 166); a location 170 with an optical setup 174, which captures an image of the physical object (unvalidated PCBA 132 upon arrival to site 150) and outputs the corresponding digital image (image 2 176); and a location 180 with an optical setup 184, which captures an image of the physical object (unvalidated PCBA 132 prior to installation into a computer system or an assembly line) and outputs the corresponding digital image (image 3 186). In site 150, locations 160 and 170 (which can be identical locations, as described above) may be distinct from or identical to location 180. For example, optical setups which capture arriving (validated or unvalidated PCBAs) may be located in an area 152 of site 150, while optical setups which capture an unvalidated PCBA immediately prior to installation may be located in an area 156 which is different from area 152. In addition, in site 150, an unvalidated PCBA may pass through one or more separate areas 154 (as indicated by operations 178), during which time the unvalidated PCBA may be handled and processed prior to installation of the unvalidated PCBA.

Specifically, at first site 110, given a validated PCBA 122 (e.g., a "golden board") and an unvalidated PCBA 132 which corresponds to validated PCBA 122, the system can generate/store an image (golden template 126) of validated PCBA 122 using optical setup 124 and also generate/store a first image (image 1 136) of unvalidated PCBA 132 captured prior to shipping unvalidated PCBA 132. Unvalidated PCBA 132 (and in some cases, validated PCBA 122) can be transported from first site 110 to second site 150 via a transport 140 (such as an airborne-vessel 142, a land-based vehicle 144, or a seaborne-vessel 146).

Upon arrival at site 150, the system can generate/store a second image (image 2 176) of unvalidated PCBA 132 using optical setup 174. In some aspects, validated PCBA 122 may also arrive at site 150. Regardless, given either validated PCBA 122 or another similarly validated PCBA 162 arriving or on site at site 150, the system can generate/store an image (silver template 166) of validated PCBA 122/162 using optical setup 164. Subsequently, unvalidated PCBA 132 may be transported within site 150 from an arrival-related location (e.g., 152) to an assembly- or installation-related location (e.g., 156), through one or more other locations (e.g., 154). During the time between arrival and installation, unvalidated PCBA 132 may be handled by various operators or machines for processing prior to installation (e.g., 178). Prior to installing unvalidated PCBA 132 in a computer system (e.g., in a server or other computing device) or an assembly line, the system can generate/store a third image (image 3 186) of unvalidated PCBA 132 using optical setup 184.

Each of the captured images (i.e., golden template 126, image 1 136, silver template 166, image 2 176, and image 3 186) can be generated, stored, managed, and analyzed by a computer vision system and by a data correlation system, as described below in relation to FIG. 3.

Figure 3:
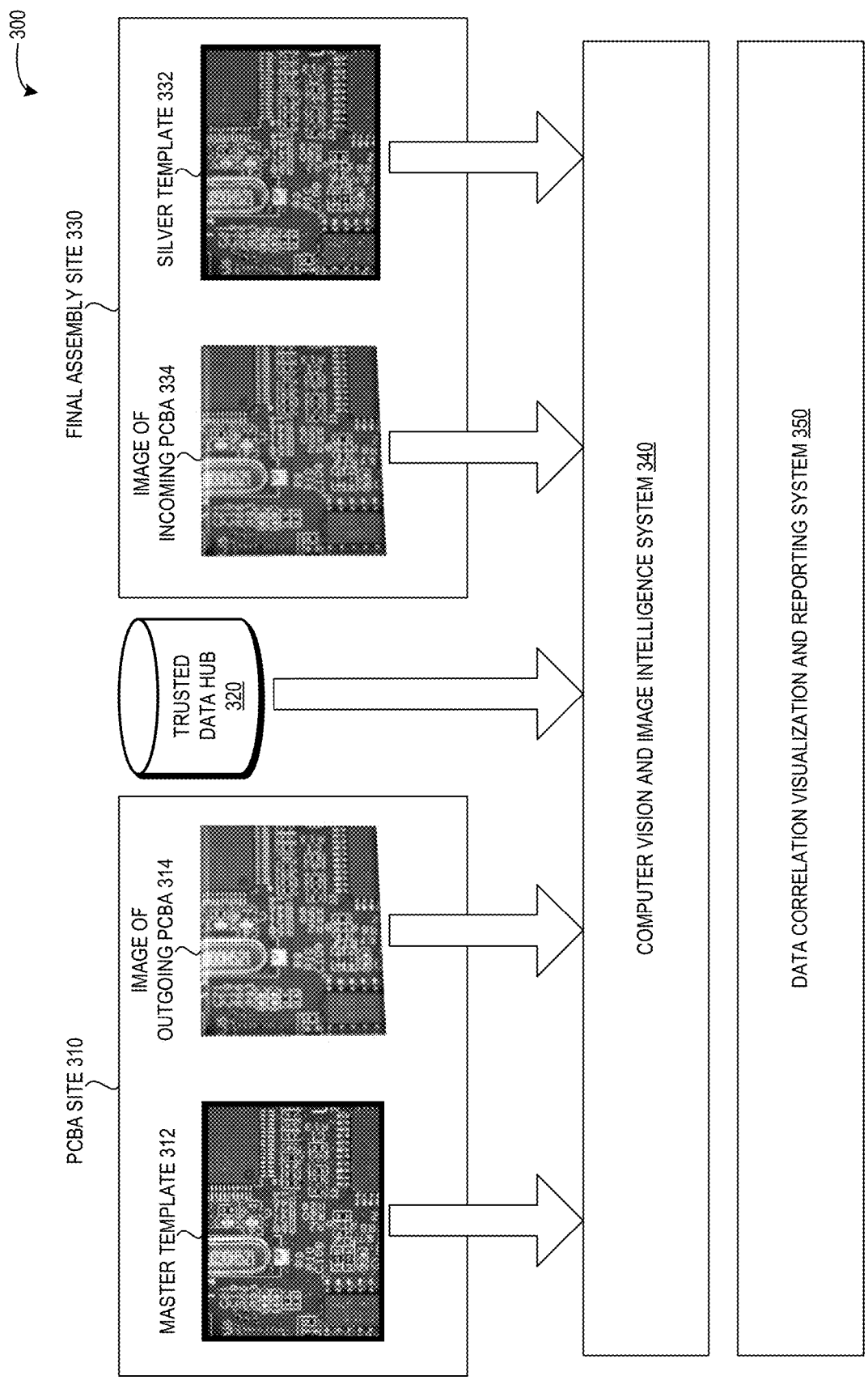
FIG. 3 illustrates an environment which facilitates a multi-tier PCBA integrity validation process, including inputs into a computer vision system, in accordance with an aspect of the present application.

FIG. 3 illustrates an environment 300 which facilitates a multi-tier PCBA integrity validation process, including inputs into a computer vision system, in accordance with an aspect of the present application. Environment 300 can include: a PCBA site 310; a trusted data hub 320; a final assembly site 330; a computer vision and image intelligence system 340; and a data correlation visualization and reporting system 350. At PCBA site 310, the system can generate a master template 312 (similar to golden template 126) and an image of outgoing PCBA 314 (similar to image 1 136) and transmit these images 312 and 314 to systems 340 and 350. Similarly, at final assembly site 330, the system can generate a silver template 332 (similar to silver template 166) and an image of incoming PCBA 334 (similar to image 2 176 or image 3 186) and transmit these images 332 and 334 to systems 340 and 350. Trusted data hub 320 can include, e.g.: work orders; build information; site information; shipping information; and component information. Furthermore, systems 340 and 350 can perform various processing and analysis of the incoming images, as described in relation to FIGS. 2A, 2B, 5A, and 5B.

Figure 4A:
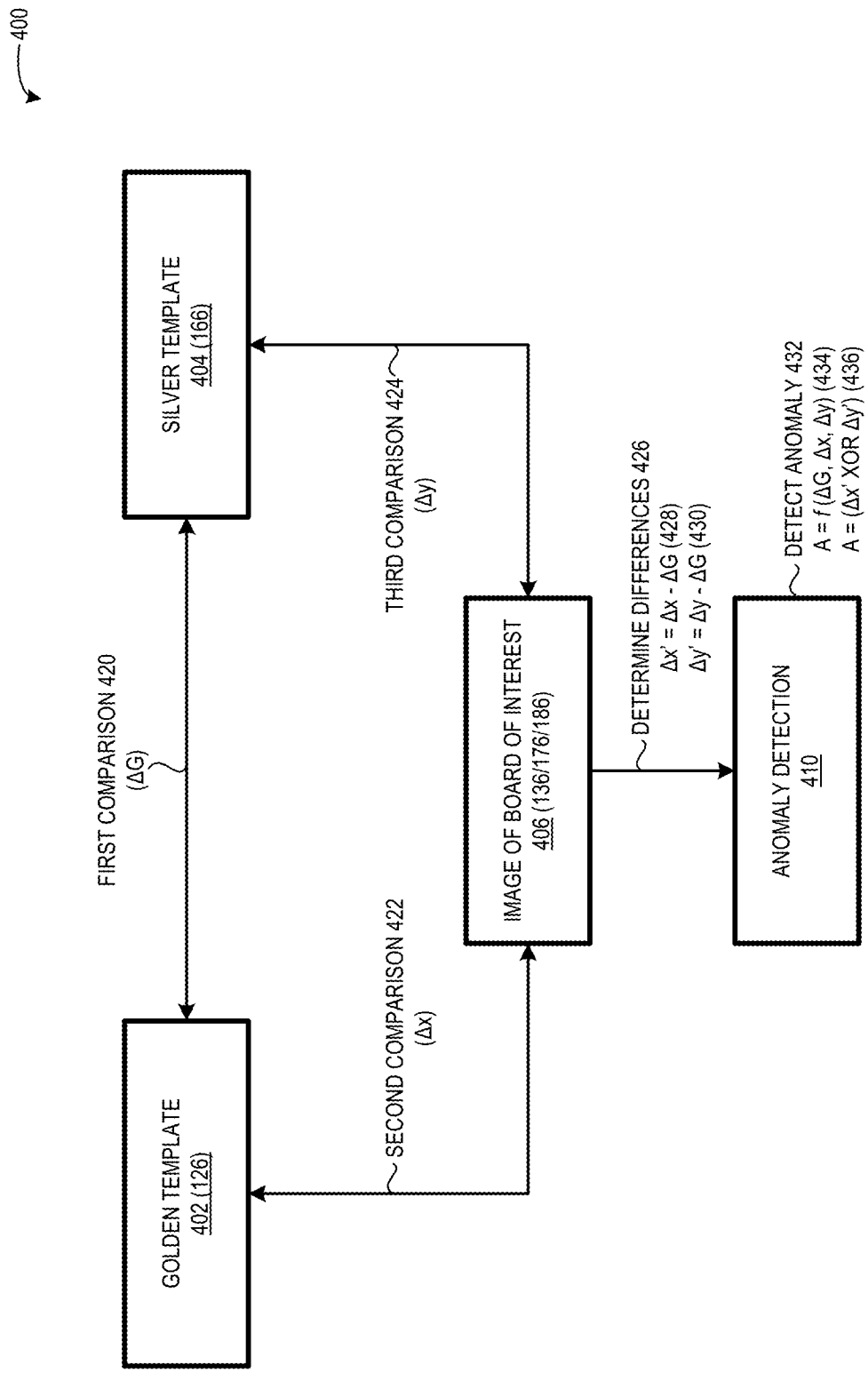
FIG. 4A illustrates an exemplary process which facilitates a multi-tier PCBA integrity validation process, including comparisons for anomaly detection, in accordance with an aspect of the present application.

Comparisons of Golden Template, Silver Template, and Images of Unvalidated PCBAs (Two or Three Images) for Anomaly Detection FIG. 4A illustrates an exemplary process 400 which facilitates a multi-tier PCBA integrity validation process, including comparisons for anomaly detection, in accordance with an aspect of the present application. Given a golden template 402 (similar to golden template 126), a silver template 404 (similar to silver template 166), and an image of a board of interest (BOI) 406 (similar to any of images 136, 176, and 186), process 400 can include: a first comparison 420 ($\Delta G$) between golden template 402 and silver template 404; a second comparison 422 ($\Delta x$) between golden template 402 and BOI image 406; and a third comparison 424 ($\Delta y$) between silver template 404 and BOI image 406. Process 400 can determine differences (operation 426), which can include: a first difference ($\Delta x'$) between a result of the first comparison and a result of the second comparison (i.e., $\Delta x - \Delta G$) (determination 428); and a second difference between the result of the first comparison and a result of the third comparison (i.e., $\Delta y - \Delta G$) (determination 430).

An anomaly detection module 410 can detect an anomaly A (operation 432) as: a function of the first comparison, the second comparison, and the third comparison (i.e., $A = f(\Delta G, \Delta x, \Delta y)$) (determination 434); or more specifically, by performing an exclusive OR on the first difference and the second difference to obtain a first operand (i.e., $A = (\Delta x'$ XOR $\Delta y')$) (determination 436). The result of determination 436 can be the first operand and can indicate whether an anomaly is present.

Figure 4B:
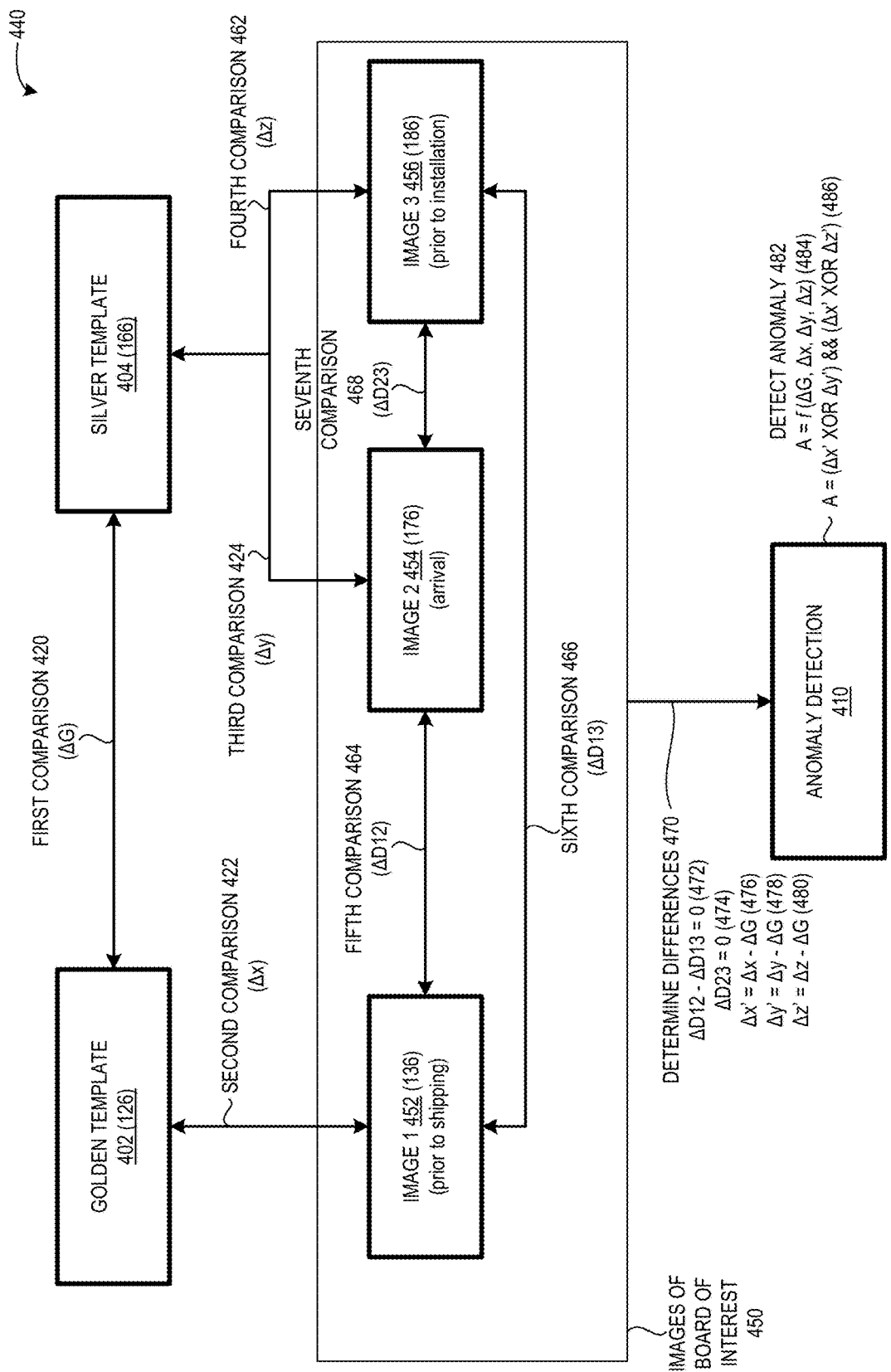
FIG. 4B illustrates an exemplary process which facilitates a multi-tier PCBA integrity validation process, including comparisons for anomaly detection, in accordance with an aspect of the present application.

FIG. 4B illustrates an exemplary process 440 which facilitates a multi-tier PCBA integrity validation process, including comparisons for anomaly detection, in accordance with an aspect of the present application. In process 440, BOI image 406 of process 400 is replaced by images of board of interest 450, which can include three images: an image 1 452 (similar to image 1 136 and captured prior to shipping from the first site to the second site); an image 2 454 (similar to image 2 176 and captured subsequent to or upon arrival at the second site); and an image 3 456 (similar to image 3 186 and captured prior to installation in a computer system or on an assembly line).

Process 440 can include: a first comparison 420 ($\Delta G$) between golden template 402 and silver template 404; a second comparison 422 ($\Delta x$) between golden template 402 and image 1 452; a third comparison 424 ($\Delta y$) between silver template 404 and image 2 454; a fourth comparison 462 ($\Delta z$) between silver template 404 and image 3 456; a fifth comparison 464 ($\Delta D12$) between image 1 452 and image 2 454; a sixth comparison 466 ($\Delta D13$) between image 1 452 and image 3 456; and a seventh comparison 468 ($\Delta D23$) between image 2 454 and image 3 456.

Process 440 can determine differences (operation 470), which can include: determining that no difference exists between a result of the fifth comparison and a result of the sixth comparison (i.e., $\Delta D12 - \Delta D13 = 0$) (determination 472); determining that no difference exists as a result of the seventh comparison (i.e., $\Delta D23 = 0$) (determination 474); determining a first difference ($\Delta x'$) between a result of the first comparison and a result of the second comparison (i.e., $\Delta x - \Delta G$) (determination 476); determining a second difference ($\Delta y'$) between the result of the first comparison and a result of the third comparison (i.e., $\Delta y - \Delta G$) (determination 478); and determining a third difference ($\Delta z'$) between the result of the first comparison and a result of the fourth comparison (i.e., $\Delta z - \Delta G$) (determination 480).

Anomaly detection module 410 can detect an anomaly A (operation 482) as a function of the first comparison, the second comparison, the third comparison, and the fourth comparison (i.e., $A = f(\Delta G, \Delta x, \Delta y, \Delta z)$) (determination 484). More specifically, anomaly detection module 410 can perform: an exclusive OR (XOR) operation on the first difference and the second difference to obtain a first operand (i.e., first operand = ($\Delta x'$ XOR $\Delta y'$); an exclusive OR (XOR) operation on the first difference and the third difference to obtain a second operation (i.e., second operand = ($\Delta x'$ XOR $\Delta z'$); and a logical AND (&&) operation on the first operand and the second operand to obtain a result which indicates whether an anomaly is present (i.e., first operand && second operand, or, more specifically, (($\Delta x'$ XOR $\Delta y'$) && ($\Delta x'$ XOR $\Delta z'$)) (determination 486).

Anomaly Detection by Performing Comparisons in Multiple Tiers and Outcome Visualization Screens The described aspects can perform the anomaly detection described above in relation to FIGS. 4A and 4B (and below in relation to FIGS. 6A, and 6B) in multiple tiers or using a layered methodology. In a first tier or layer, the system can perform the comparisons based on the physical space or estate occupied by the components on a given PCBA, e.g., a percentage of space occupied and not occupied by components residing on the PCBAs in the first template, the second template, the first image, the second image, and the third image. In a second tier or layer, the system can perform the comparisons based on the number of components on the given PCBA, e.g., a number of components residing on the PCBAs in the first template, the second template, the first image, the second image, and the third image. In a third tier or layer, the system can perform the comparisons based on tracks which run on the given PCBA, e.g., a placement of tracks which run on the PCBAs in the first template, the second template, the first image, the second image, and the third image.

Based on the comparisons from these multiple tiers or layers, the system can detect an anomaly (e.g., possible fraud) and determine certain information such as: whether a component is different in one image versus another image; whether a solder associated with a component is not proper in one image versus another image; whether a component has shifted in one image versus another image; and whether the color of a track has changed, e.g., from a copper color to a black color, which can indicate that the track has been tempered or undergone a significant temperature change.

The system (e.g., computer vision and image intelligence system 340 and data correlation visualization and reporting system 350 of FIG. 3) can generate a color-coded map as well as specific layer maps for each tier (i.e., layer 1 estate, layer 2 component, and layer 3 PCB runner). The system can also use a heat map to identify different segments of a given PCBA or PCB/PCBA component. The system can further use machine learning to identify and classify components, features, characteristics, and anomalies.

Figure 5A:
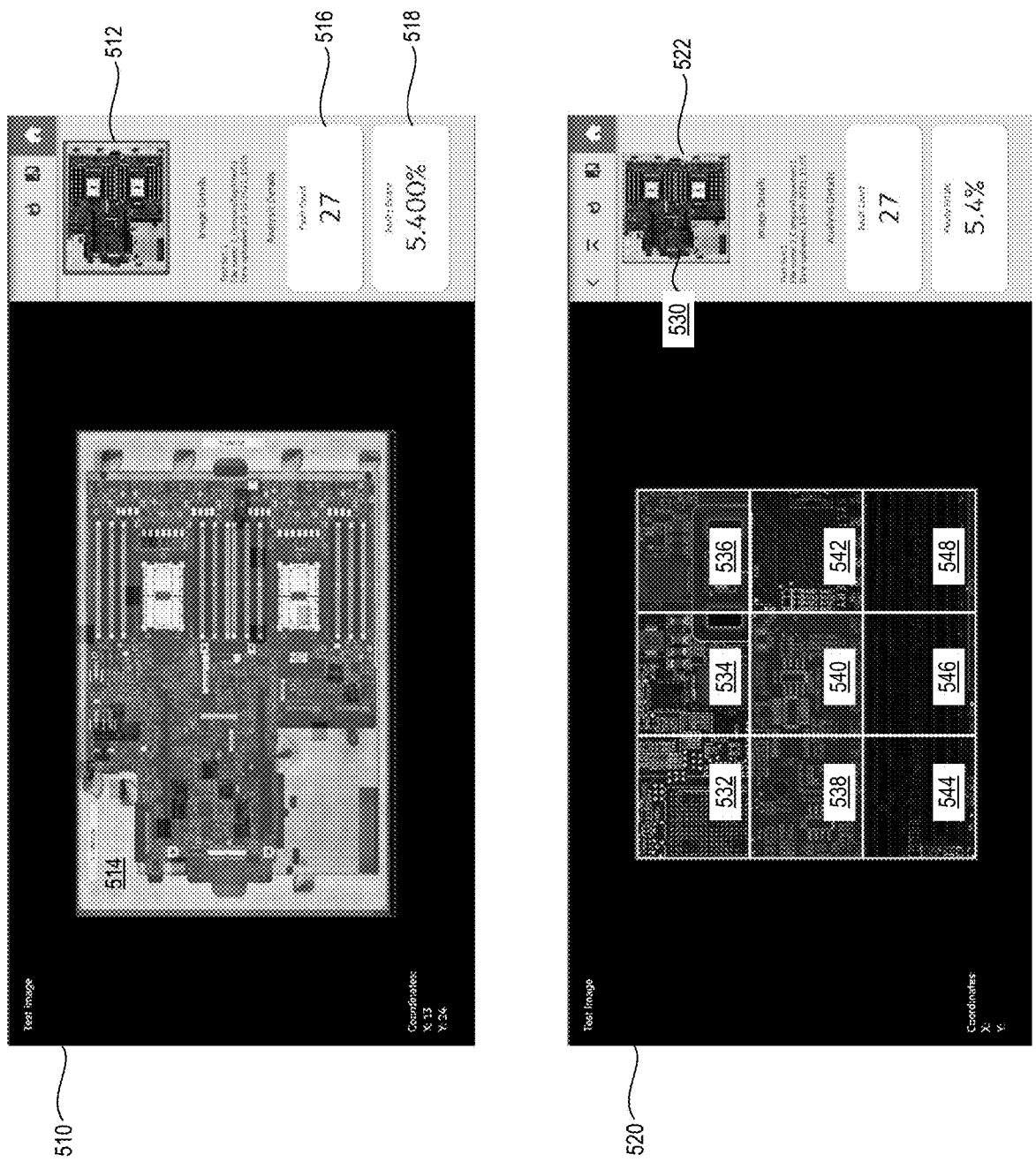
FIG. 5A presents screens which can be displayed to a user as part of anomaly detection, in accordance with an aspect of the present application.

FIG. 5A presents screens 510 and 520 which can be displayed to a user as part of anomaly detection, in accordance with an aspect of the present application. Screen 510 can include a left pane which displays a zoomed-in view 514 of a PCBA 512 (or other component), as shown in a right pane and indicated with a red outline. Zoomed-in view 514 can indicate faulty components or areas of PCBA 512 using visual indicators such as color, shading, or other distinguishing labels (e.g., as indicated with the overlaying red-colored portions in zoomed-in view 514). Screen 510 can also include information relating to anomaly detection of a certain characteristic of the PCBA, e.g., a fault count for a number of components of 27 (element 516) and a faulty estate percentage of 5.400% (element 518). Screen 510 can include actionable elements as part of a graphical user interface which allows a user to select a faulty component or area in zoomed-in view 514 and can result in the display of screen 520.

Screen 520 can include the left pane which displays a zoomed-in view of an identified or visually indicated faulty component 530 of PCBA 522 (as shown with a red outline in the right pane). The zoomed-in view of faulty component 530 can be divided into several segments, e.g., a 3×3 grid of nine squares indicated as squares 532-548. Some of the squares may appear with the faulty visual indicator (e.g., the overlaying red color in squares 536, 538, and 540) while others may appear without the faulty visual indicator (e.g., squares 532, 534, 542, 544, 546, and 548). The user may select one of the squares with the faulty visual indicator (e.g., square 540 with the overlaying red color), which can result in the display of screen 550 of FIG. 5B.

Figure 5B:
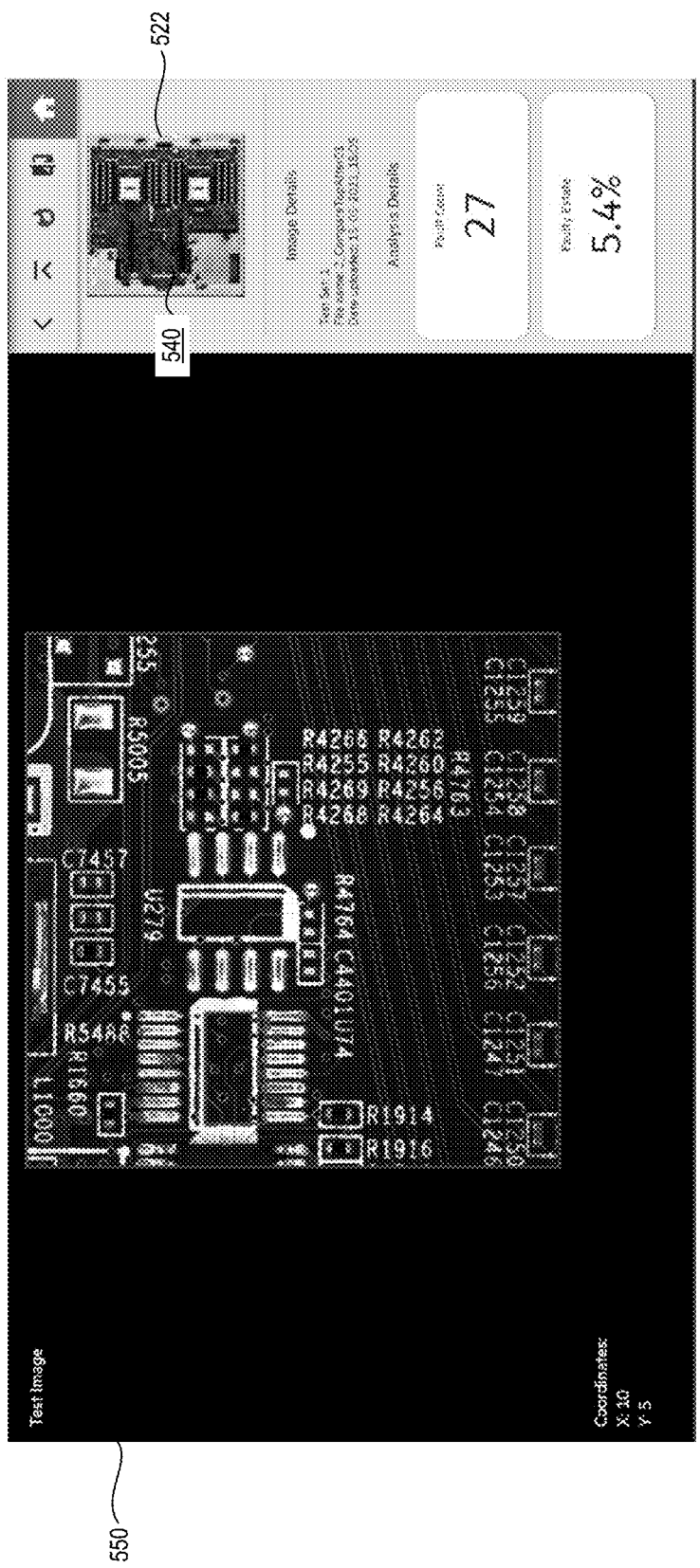
FIG. 5B presents a screen which can be displayed to a user as part of anomaly detection, in accordance with an aspect of the present application.

FIG. 5B presents a screen 550 which can be displayed to a user as part of anomaly detection, in accordance with an aspect of the present application. Screen 550 can include the left pane which displays a zoomed-in view of a previously selected portion (square 540 shown with a red outline) of PCBA 522 (as shown in the right pane). In the left pane, the zoomed view of square 540 can further indicate, in greater detail, faulty components or areas in square 540 of PCBA 512 using visual indicator such as color, shading, or other distinguishing label (e.g., a red outline in a rectangular or circular shape). Further zoomed-in views which result in subsequent screens are possible (not shown). In addition, screens 510, 520, and 550 may display other information, including X-Y coordinates which indicate a location of the zoomed-in view in relation to the entire PCBA or selected component (e.g., a square), as well as information related to any analysis performed by the modules described above in relation to FIGS. 2A and 2B.

Methods which Facilitates a Multi-Tier PCBA Integrity Validation Process

Figure 6A:
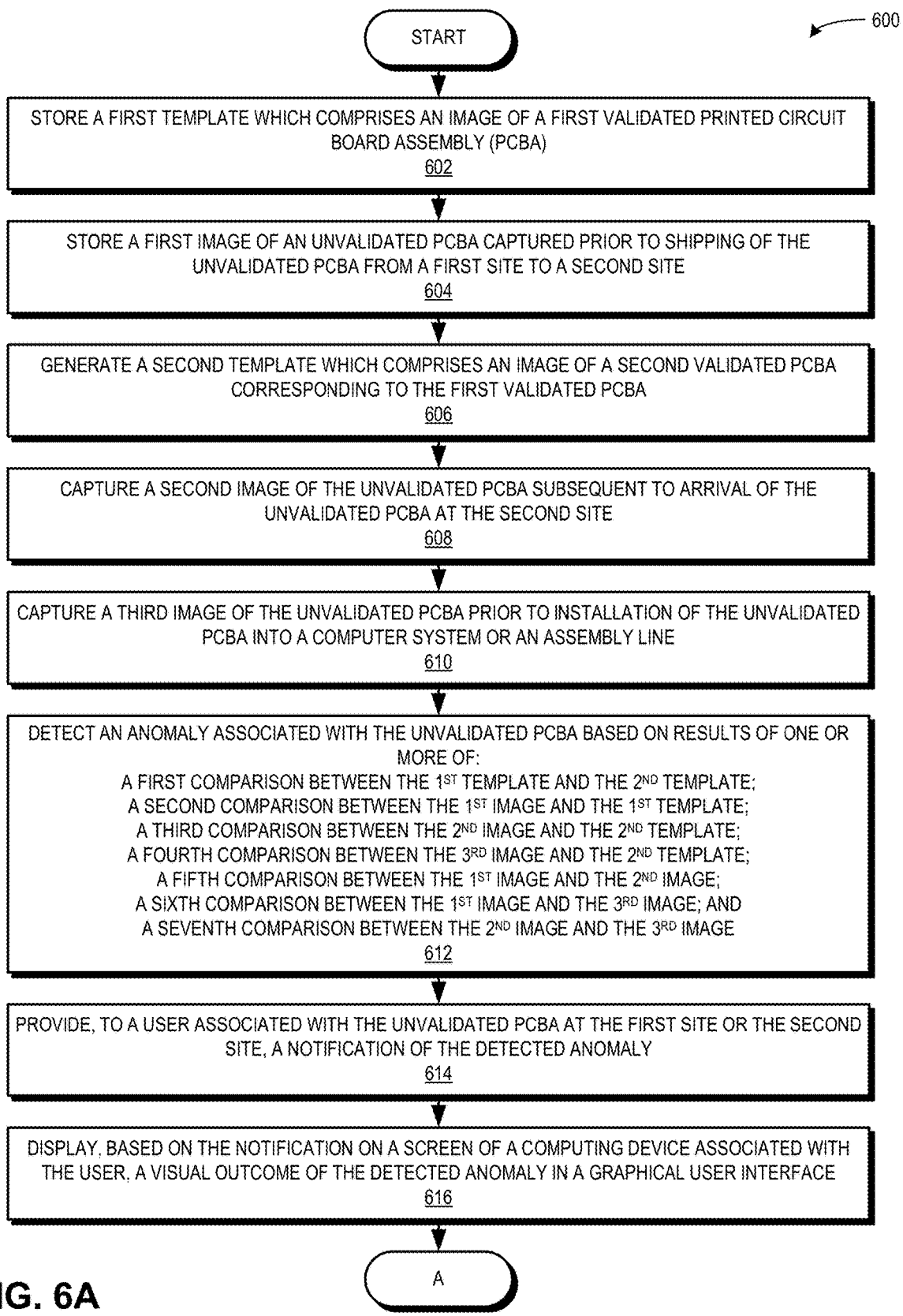
FIG. 6A presents a flowchart illustrating a method which facilitates a multi-tier PCBA integrity validation process, in accordance with an aspect of the present application.

FIG. 6A presents a flowchart 600 illustrating a method which facilitates a multi-tier PCBA integrity validation process, in accordance with an aspect of the present application. During operation, the system stores a first template which comprises an image of a first validated printed circuit board assembly (PCBA) (operation 602). The system stores a first image of an unvalidated PCBA captured prior to shipping of the unvalidated PCBA from a first site to a second site (operation 604). The system generates a second template which comprises an image of a second validated PCBA corresponding to the first validated PCBA (operation 606). The second validated PCBA may be the same or a different board than the first validated PCBA. The system captures a second image of the unvalidated PCBA subsequent to arrival of the unvalidated PCBA at the second site (operation 608). The system captures a third image of the unvalidated PCBA prior to installation of the unvalidated PCBA into a computer system or an assembly line (operation 610). The system detects an anomaly associated with the unvalidated PCBA based on results of one or more of: a first comparison between the first template and the second template; a second comparison between the first image and the first template; a third comparison between the second image and the second template; a fourth comparison between the third image and the second template; a fifth comparison between the first image and the second image; a sixth comparison between the first image and the third image; and a seventh comparison between the second image and the third image (operation 612). The system provides, to a user associated with the unvalidated PCBA at the first site or the second site, a notification of the detected anomaly (operation 614). The system displays, based on the notification on a screen of a computing device associated with the user, a visual outcome of the detected anomaly in a graphical user interface (operation 616). The operation continues at Label A of FIG. 6B.

Figure 6B:
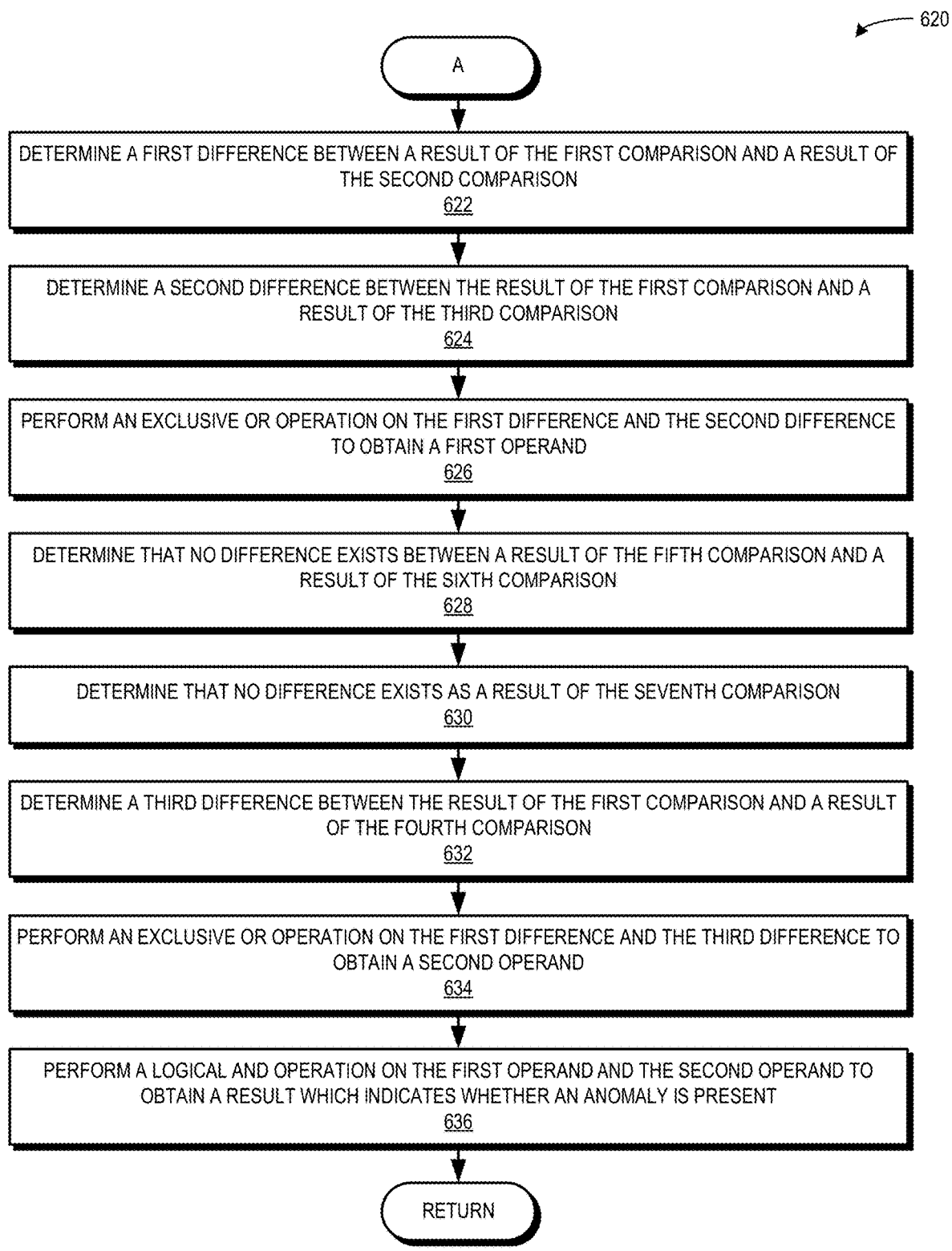
FIG. 6B presents a flowchart illustrating a method which facilitates a multi-tier PCBA integrity validation process, in accordance with an aspect of the present application.

FIG. 6B presents a flowchart 620 illustrating a method which facilitates a multi-tier PCBA integrity validation process, in accordance with an aspect of the present application. Flowchart 620 illustrates how the system can detect an anomaly using the results of the comparisons described above in FIGS. 4A, 4B, and 6A. The system determines a first difference between a result of the first comparison and a result of the second comparison (operation 622). The system determines a second difference between the result of the first comparison and a result of the third comparison (operation 624). The system performs an XOR operation on the first difference and the second difference to obtain a first operand (operation 626). In some aspects, the first operand indicates whether an anomaly is present (as described above in relation to FIG. 4A).

The system determines that no difference exists between a result of the fifth comparison and a result of the sixth comparison (operation 628) and determines that no difference exists as a result of the seventh comparison (operation 630). The system determines a third difference between the result of the first comparison and a result of the fourth comparison (operation 632). The system performs an XOR operation on the first difference and the third difference to obtain a second operand (operation 634). The system performs a logical AND operation on the first operand and the second operand to obtain a result which indicates whether an anomaly is present (operation 636). The operation returns.

Computer System and Apparatus

Figure 7:
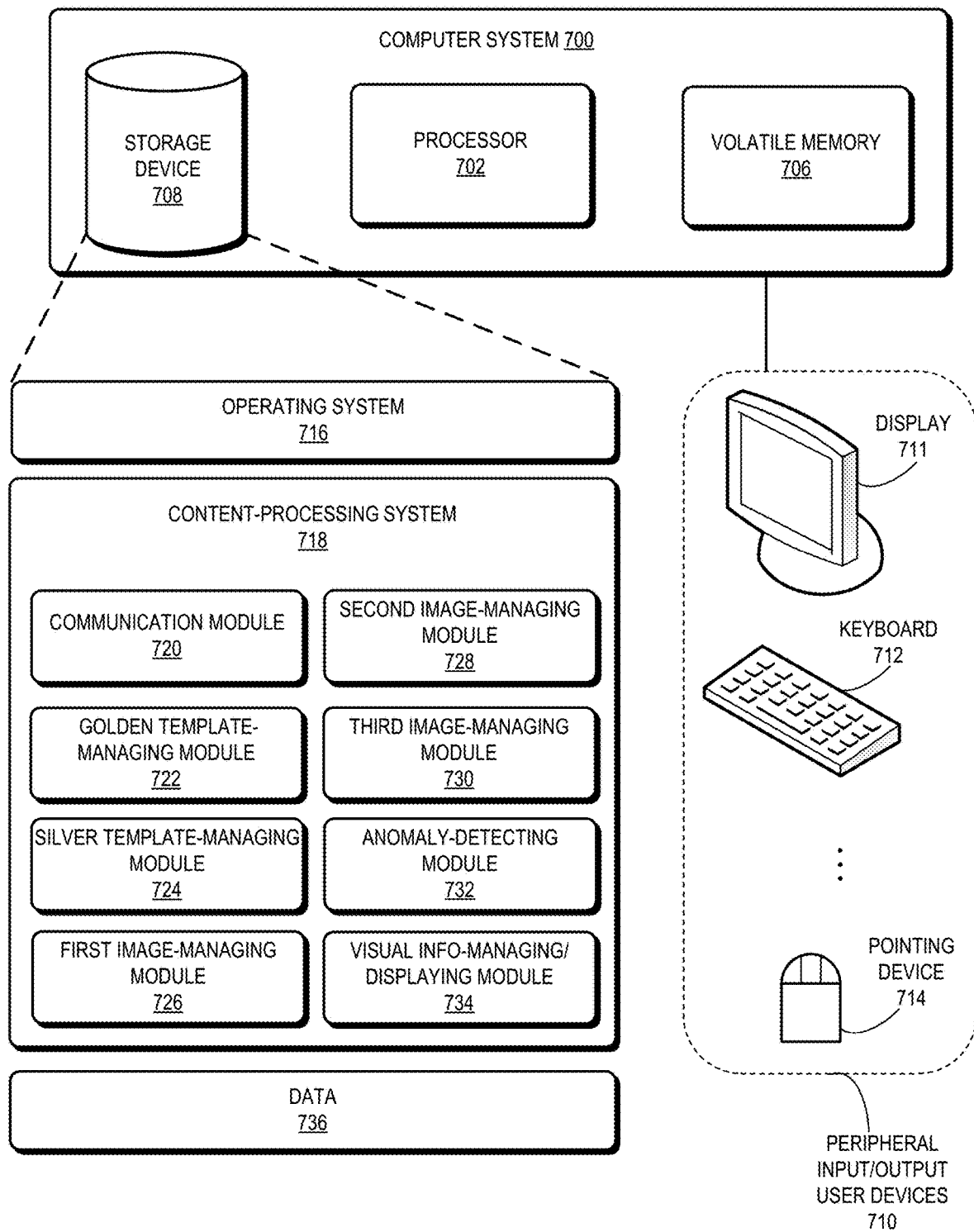
FIG. 7 illustrates a computer system which facilitates a multi-tier PCBA integrity validation process, in accordance with an aspect of the present application.

FIG. 7 illustrates a computer system which facilitates a multi-tier PCBA integrity validation process, in accordance with an aspect of the present application. Computer system 700 includes a processor 702, a volatile memory 706, and a storage device 708. Volatile memory 706 can include, e.g., random access memory (RAM), that serves as a managed memory, and can be used to store one or more memory pools. Storage device 708 can include persistent storage which can be managed or accessed via processor 702. Furthermore, computer system 700 can be coupled to peripheral input/output (I/O) user devices 710, e.g., a display device 711, a keyboard 712, and a pointing device 714. Storage device 708 can store an operating system 716, a content-processing system 718, and data 736. Computer system 700 may include fewer or more modules than those shown in FIG. 7.

Content-processing system 718 can include instructions, which when executed by computer system 700, can cause computer system 700 or processor 702 to perform methods and/or processes described in this disclosure. Specifically, content-processing system 718 can include instructions for receiving and transmitting data packets and instructions relating to images, notifications, and anomalies (communication module 720).

Content-processing system 718 can further include instructions for storing a first template which comprises an image of a first validated PCBA (golden template-managing module 722). Content-processing system 718 can include instructions for storing a first image of an unvalidated PCBA captured prior to shipping of the unvalidated PCBA from a first site to a second site (first image-managing module 726). Content-processing system 718 can include instructions for generating a second template which comprises an image of a second validated PCBA corresponding to the first validated PCBA (silver template-managing module 724). Content-processing system 718 can include instructions for capturing a second image of the unvalidated PCBA subsequent to arrival of the unvalidated PCBA at the second site (second image-managing module 728). Content-processing system 718 can include instructions for capturing a third image of the unvalidated PCBA prior to installation of the unvalidated PCBA into a computer system or an assembly line (third image-managing module 730). Content-processing system 718 can also include instructions for detecting an anomaly associated with the unvalidated PCBA based on results of one or more of: a first comparison between the first template and the second template; a second comparison between the first image and the first template; a third comparison between the second image and the second template; a fourth comparison between the third image and the second template; a fifth comparison between the first image and the second image; a sixth comparison between the first image and the third image; and a seventh comparison between the second image and the third image (anomaly-detecting module 732).

Content-processing system 718 can additionally include instructions for providing, to a user associated with the unvalidated printed circuit board at the first site or the second site, a notification of the detected anomaly, and displaying, based on the notification on a screen of a computing device associated with the user, a visual outcome of the detected anomaly in a graphical user interface (visual information-managing/displaying module 734) (as described above in relation to FIGS. 5A and 5B).

Data 736 can include any data that is required as input or generated as output by the methods and/or processes described in this disclosure. Specifically, data 736 can store at least: a template; an image; an image of a validated or an unvalidated PCBA; an image of an unvalidated PCBA at three different times (e.g., first, second, and third images as described in relation to FIGS. 1 and 4B); an indicator of an anomaly; a comparison between template, images, and a template and an image; a result of a comparison; an indicator of an optical setup; a site identifier; a difference; a result of an exclusive OR or a logical AND operation; a percentage of space occupied and not occupied by components residing on a PCBA; a number of components residing on a PCBA; an indicator of a placement of tracks which run on a PCBA; a notification of a detected anomaly; and information to be displayed as a visual outcome of a detected anomaly.

Figure 8:
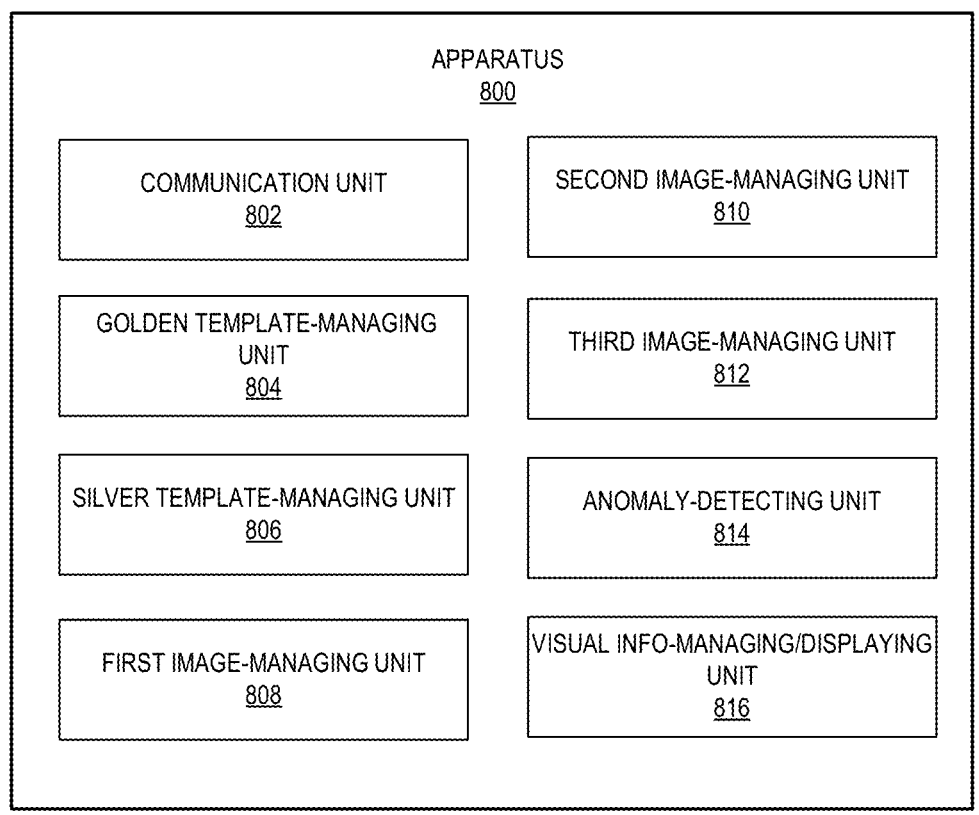
FIG. 8 illustrates an apparatus which facilitates a multi-tier PCBA integrity validation process, in accordance with an aspect of the present application.

FIG. 8 illustrates an apparatus 800 which facilitates a multi-tier PCBA integrity validation process, in accordance with an aspect of the present application. Apparatus 800 can comprise a plurality of units or apparatuses which may communicate with one another via a wired, wireless, quantum light, or electrical communication channel. Apparatus 800 may be realized using one or more integrated circuits, and may include fewer or more units or apparatuses than those shown in FIG. 8. Furthermore, apparatus 800 may be integrated in a computer system, or realized as a separate device or devices capable of communicating with other computer systems and/or devices.

Apparatus 800 may also include a non-volatile storage system or a memory management unit. Apparatus 800 can comprise modules or units 802-816 which are configured to perform functions or operations similar to modules 720-734 of computer system 700 of FIG. 7, including: a communication unit 802; a golden template-managing unit 804; a silver template-managing unit 806; a first image-managing unit 808; a second image-managing unit 810; a third image-managing unit 812; an anomaly-detecting unit 814; and a visual information-managing/displaying unit 816.

In general, the disclosed aspects provide a system for facilitating a multi-tier PCBA integrity validation process. As described above, the terms "PCB" and "PCBA" are used interchangeably in this disclosure. In one aspect, during operation, the system stores a first template which comprises an image of a first validated printed circuit board assembly (PCBA). The system stores a first image of an unvalidated PCBA captured prior to shipping of the unvalidated PCBA from a first site to a second site. The system generates a second template which comprises an image of a second validated PCBA corresponding to the first validated PCBA. The system captures a second image of the unvalidated PCBA subsequent to arrival of the unvalidated PCBA at the second site. The system captures a third image of the unvalidated PCBA prior to installation of the unvalidated PCBA into a computer system or an assembly line. The system detects an anomaly associated with the unvalidated PCBA based on results of one or more of: a first comparison between the first template and the second template; a second comparison between the first image and the first template; a third comparison between the second image and the second template; a fourth comparison between the third image and the second template; a fifth comparison between the first image and the second image; a sixth comparison between the first image and the third image; and a seventh comparison between the second image and the third image.

In a variation on this aspect, the first template is generated by capturing the image of the first validated PCBA based on a first optical setup at the first site, and the second template is generated by capturing the image of the second validated circuit board based on a second optical setup at the second site. The first and second optical setup may be configured to match as closely as possible.

In a further variation on this aspect, the system ships the first validated PCBA from the first site to the second site, and the second validated PCBA comprises the first validated PCBA.

In a further variation, the system detects the anomaly further based on: determining a first difference between a result of the first comparison and a result of the second comparison; determining a second difference between the result of the first comparison and a result of the third comparison; and performing an exclusive OR on the first difference and the second difference to obtain a first operand, wherein the first operand indicates whether an anomaly is present.

In a further variation, the system detects the anomaly further based on: determining that no difference exists between a result of the fifth comparison and a result of the sixth comparison; and determining that no difference exists as a result of the seventh comparison.

In a further variation, the system detects the anomaly further based on: determining a third difference between the result of the first comparison and a result of the fourth comparison; performing an exclusive OR on the first difference and the third difference to obtain a second operand; and performing a logical AND on the first operand and the second operand to obtain a result which indicates whether an anomaly is present.

In a further variation, the system detects the anomaly further based on performing the comparisons in multiple tiers, based on each of: a percentage of space occupied and not occupied by components residing on the PCBAs in the first template, the second template, the first image, the second image, and the third image; a number of components residing on the PCBAs in the first template, the second template, the first image, the second image, and the third image; and a placement of tracks which run on the PCBAs in the first template, the second template, the first image, the second image, and the third image.

In a further variation, detecting the anomaly is performed by a computer vision system. The system provides, by the computer vision system to a user associated with the unvalidated PCBA at the first site or the second site, a notification of the detected anomaly. The system displays, based on the notification on a screen of a computing device associated with the user, a visual outcome of the detected anomaly in a graphical user interface.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware devices or apparatus. For example, the hardware devices or apparatus can include, but are not limited to, application-specific integrated circuit (ASIC) chips, field-programmable gate arrays (FPGAs), dedicated or shared processors that execute a particular software program or a piece of code at a particular time, and other programmable-logic devices now known or later developed. When the hardware devices or apparatus are activated, the hardware modules perform the methods and processes included within them.

The foregoing descriptions of aspects have been presented for purposes of illustration and description only. They are not intended to be exhaustive or to limit the aspects described herein to the forms disclosed. Accordingly, many modifications and variations will be apparent to practitioners skilled in the art. Additionally, the above disclosure is not intended to limit the aspects described herein. The scope of the aspects described herein is defined by the appended claims.

What is claimed is:

1. A method, comprising:
   storing a first template which comprises an image of a first validated printed circuit board;
   storing a first image of an unvalidated printed circuit board captured prior to shipping of the unvalidated printed circuit board from a first site to a second site;
   generating a second template which comprises an image of a second validated printed circuit board corresponding to the first validated printed circuit board;
   capturing a second image of the unvalidated printed circuit board subsequent to arrival of the unvalidated printed circuit board at the second site;
   capturing a third image of the unvalidated printed circuit board prior to installation of the unvalidated printed circuit board into a computer system or an assembly line; and
   detecting an anomaly associated with the unvalidated printed circuit board based on results of one or more of:
      a first comparison between the first template and the second template;
      a second comparison between the first image and the first template;
      a third comparison between the second image and the second template;
      a fourth comparison between the third image and the second template;
      a fifth comparison between the first image and the second image;
      a sixth comparison between the first image and the third image; and
      a seventh comparison between the second image and the third image.

2. The method of claim 1,
wherein the first template is generated by capturing the image of the first validated printed circuit board based on a first optical setup at the first site, and
wherein the second template is generated by capturing the image of the second validated circuit board based on a second optical setup at the second site.

3. The method of claim 1, further comprising:
shipping the first validated printed circuit board from the first site to the second site,
wherein the second validated printed circuit board comprises the first validated printed circuit board.

4. The method of claim 1, wherein detecting the anomaly is further based on:
determining a first difference between a result of the first comparison and a result of the second comparison;
determining a second difference between the result of the first comparison and a result of the third comparison; and
performing an exclusive OR on the first difference and the second difference to obtain a first operand,
wherein the first operand indicates whether an anomaly is present.

5. The method of claim 4, wherein detecting the anomaly is further based on:
determining that no difference exists between a result of the fifth comparison and a result of the sixth comparison; and
determining that no difference exists as a result of the seventh comparison.

6. The method of claim 5, wherein detecting the anomaly is further based on:
determining a third difference between the result of the first comparison and a result of the fourth comparison;
performing an exclusive OR on the first difference and the third difference to obtain a second operand; and
performing a logical AND on the first operand and the second operand to obtain a result which indicates whether an anomaly is present.

7. The method of claim 1, wherein detecting the anomaly is further based on performing the comparisons in multiple tiers based on each of:
a percentage of space occupied and not occupied by components residing on the printed circuit boards in the first template, the second template, the first image, the second image, and the third image;
a number of components residing on the printed circuit boards in the first template, the second template, the first image, the second image, and the third image; and
a placement of tracks which run on the printed circuit boards in the first template, the second template, the first image, the second image, and the third image.

8. The method of claim 1, wherein detecting the anomaly is performed by a computer vision system, and wherein the method further comprises:
providing, by the computer vision system to a user associated with the unvalidated printed circuit board at the first site or the second site, a notification of the detected anomaly; and
displaying, based on the notification on a screen of a computing device associated with the user, a visual outcome of the detected anomaly in a graphical user interface.

9. A computer system, comprising:
a processor; and
a memory coupled to the processor and storing instructions which, when executed by the processor, cause the processor to perform a method, the method comprising:
storing a first template which comprises an image of a first validated printed circuit board;
storing a first image of an unvalidated printed circuit board captured prior to shipping of the unvalidated printed circuit board from a first site to a second site;
generating a second template which comprises an image of a second validated printed circuit board corresponding to the first validated printed circuit board;
capturing a second image of the unvalidated printed circuit board subsequent to arrival of the unvalidated printed circuit board at the second site;
capturing a third image of the unvalidated printed circuit board prior to installation of the unvalidated printed circuit board into a computer system or an assembly line; and
detecting an anomaly associated with the unvalidated printed circuit board based on results of one or more of:
a first comparison between the first template and the second template;
a second comparison between the first image and the first template;
a third comparison between the second image and the second template;
a fourth comparison between the third image and the second template;
a fifth comparison between the first image and the second image;
a sixth comparison between the first image and the third image; and
a seventh comparison between the second image and the third image.

10. The computer system of claim 9,
wherein the first template is generated by capturing the image of the first validated printed circuit board based on a first optical setup at the first site, and
wherein the second template is generated by capturing the image of the second validated circuit board based on a second optical setup at the second site.

11. The computer system of claim 9, wherein the method further comprises:
shipping the first validated printed circuit board from the first site to the second site,
wherein the second validated printed circuit board comprises the first validated printed circuit board.

12. The computer system of claim 9, wherein detecting the anomaly is further based on:
determining a first difference between a result of the first comparison and a result of the second comparison;
determining a second difference between the result of the first comparison and a result of the third comparison; and
performing an exclusive OR on the first difference and the second difference to obtain a first operand,
wherein the first operand indicates whether an anomaly is present.

13. The computer system of claim 12, wherein detecting the anomaly is further based on:
determining that no difference exists between a result of the fifth comparison and a result of the sixth comparison; and
determining that no difference exists as a result of the seventh comparison.

14. The computer system of claim 13, wherein detecting the anomaly is further based on:
  determining a third difference between the result of the first comparison and a result of the fourth comparison;
  performing an exclusive OR on the first difference and the third difference to obtain a second operand; and
  performing a logical AND on the first operand and the second operand to obtain a result which indicates whether an anomaly is present.

15. The computer system of claim 9, wherein detecting the anomaly is further based on performing the comparisons in multiple tiers based on each of:
  a percentage of space occupied and not occupied by components residing on the printed circuit boards in the first template, the second template, the first image, the second image, and the third image;
  a number of components residing on the printed circuit boards in the first template, the second template, the first image, the second image, and the third image; and
  a placement of tracks which run on the printed circuit boards in the first template, the second template, the first image, the second image, and the third image.

16. The computer system of claim 9, wherein detecting the anomaly is performed by a computer vision system, and wherein the method further comprises:
  providing, by the computer vision system to a user associated with the unvalidated printed circuit board at the first site or the second site, a notification of the detected anomaly; and
  displaying, based on the notification on a screen of a computing device associated with the user, a visual outcome of the detected anomaly in a graphical user interface.

17. A non-transitory computer-readable storage medium storing instructions that when executed by a computer cause the computer to perform a method, the method comprising:
  storing a first template which comprises an image of a first validated printed circuit board;
  storing a first image of an unvalidated printed circuit board captured prior to shipping of the unvalidated printed circuit board from a first site to a second site;
  generating a second template which comprises an image of a second validated printed circuit board corresponding to the first validated printed circuit board;
  capturing a second image of the unvalidated printed circuit board subsequent to arrival of the unvalidated printed circuit board at the second site;
  capturing a third image of the unvalidated printed circuit board prior to installation of the unvalidated printed circuit board into a computer system or an assembly line; and
  detecting an anomaly associated with the unvalidated printed circuit board based on results of one or more of:
    a first comparison between the first template and the second template;
    a second comparison between the first image and the first template;
    a third comparison between the second image and the second template;
    a fourth comparison between the third image and the second template;
    a fifth comparison between the first image and the second image;
    a sixth comparison between the first image and the third image; and
    a seventh comparison between the second image and the third image.

18. The non-transitory computer-readable storage medium of claim 17, wherein detecting the anomaly is further based on:
  determining a first difference between a result of the first comparison and a result of the second comparison;
  determining a second difference between the result of the first comparison and a result of the third comparison; and
  performing an exclusive OR on the first difference and the second difference to obtain a first operand,
  wherein the first operand indicates whether an anomaly is present.

19. The non-transitory computer-readable storage medium of claim 18, wherein detecting the anomaly is further based on:
  determining that no difference exists between a result of the fifth comparison and a result of the sixth comparison;
  determining that no difference exists as a result of the seventh comparison determining a third difference between the result of the first comparison and a result of the fourth comparison;
  performing an exclusive OR on the first difference and the third difference to obtain a second operand; and
  performing a logical AND on the first operand and the second operand to obtain a result which indicates whether an anomaly is present.

20. The non-transitory computer-readable storage medium of claim 17, wherein detecting the anomaly is further based on performing the comparisons in multiple tiers based on each of:
  a percentage of space occupied and not occupied by components residing on the printed circuit boards in the first template, the second template, the first image, the second image, and the third image;
  a number of components residing on the printed circuit boards in the first template, the second template, the first image, the second image, and the third image; and
  a placement of tracks which run on the printed circuit boards in the first template, the second template, the first image, the second image, and the third image.

\* \* \* \* \*